United States Patent [19]

Rippy

[11] 3,997,848
[45] Dec. 14, 1976

[54] LINEAR PHASE DEMODULATOR INCLUDING A PHASE LOCKED LOOP WITH AUXILIARY FEEDBACK LOOP

[75] Inventor: Ronnie R. Rippy, Alexandria, Va.

[73] Assignee: The United States of America as represented by the Administrator of the National Aeronautics and Space Administration, Washington, D.C.

[22] Filed: Nov. 26, 1975

[21] Appl. No.: 635,531

[52] U.S. Cl. .............................. 329/122; 329/124; 331/23; 331/36 C; 332/30 V
[51] Int. Cl.² ...................... H03C 3/22; H03D 3/20
[58] Field of Search ........... 329/50, 122, 124, 125; 332/30 V; 331/23, 36 C, 177 V

[56] References Cited

UNITED STATES PATENTS

| | | | |
|---|---|---|---|
| 3,479,615 | 11/1969 | Garver | 332/30 V |
| 3,600,700 | 8/1971 | Matsuo | 329/122 X |
| 3,657,661 | 4/1972 | Jarger | 329/50 X |
| 3,745,255 | 7/1973 | Fletcher et al. | 329/122 X |

Primary Examiner—Siegfried H. Grimm
Attorney, Agent, or Firm—John R. Tresansky; Robert D. Marchant; Gary F. Grafel

[57] ABSTRACT

A phase modulated wave that may have no carrier power is demodulated by a phase locked loop including a phase detector for deriving an A.C. data output signal having a magnitude and a phase indicative of the phase of the modulated wave. A feedback loop responsive to the data output signal restores power to the carrier frequency component to the loop. In one embodiment, the feedback loop includes a phase modulator responsive to the phase modulated wave and the data output signal. In a second embodiment, carrier frequency power is restored by differentiating the data output signal and supplying the differentiated signal to an input of a voltage controlled oscillator included in the phase locked loop. Preferably, the phase modulator is linear and includes a series inductance-capacitance network, wherein the capacitor is a voltage controlled varactor. To compensate for nonlinearities in the varactor reactance vs. voltage characteristic, the series circuit is shunted by a properly selected inductance.

11 Claims, 3 Drawing Figures

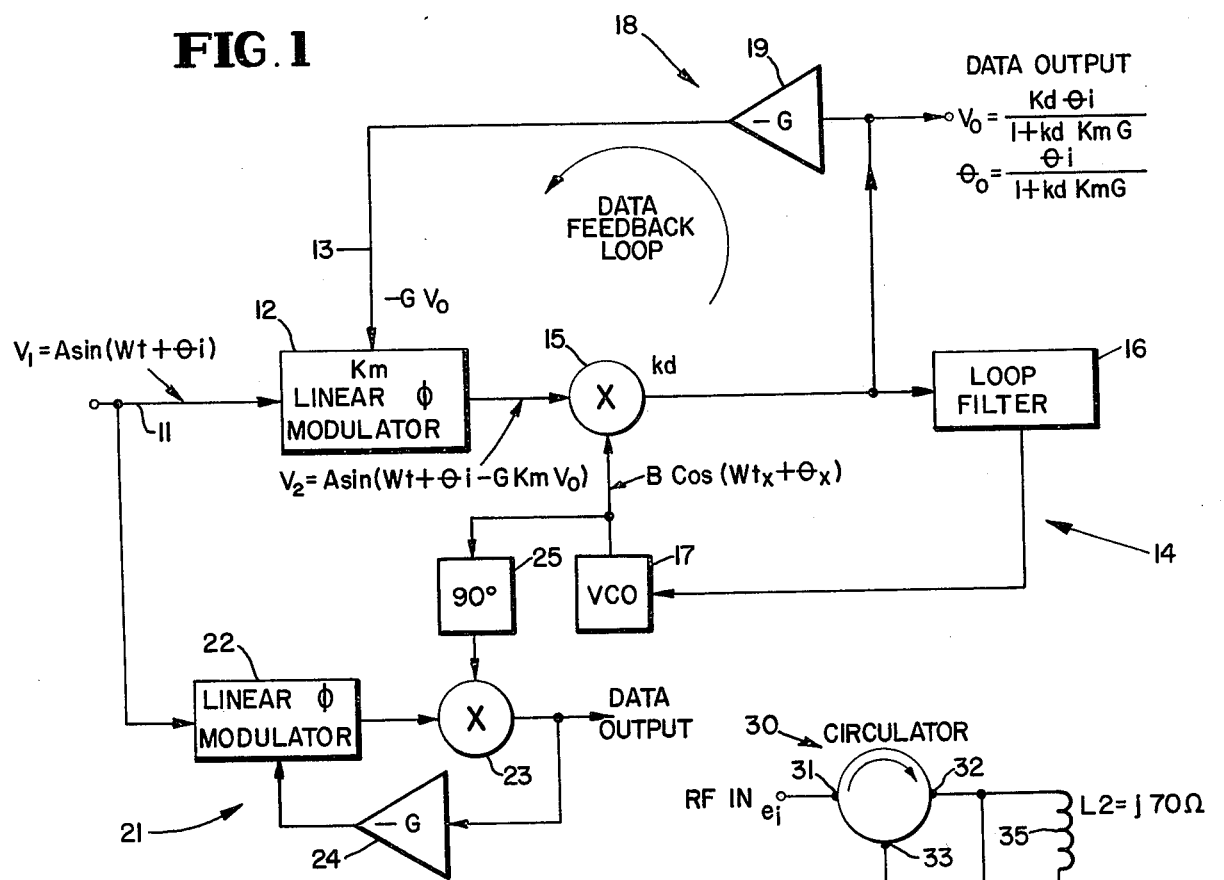
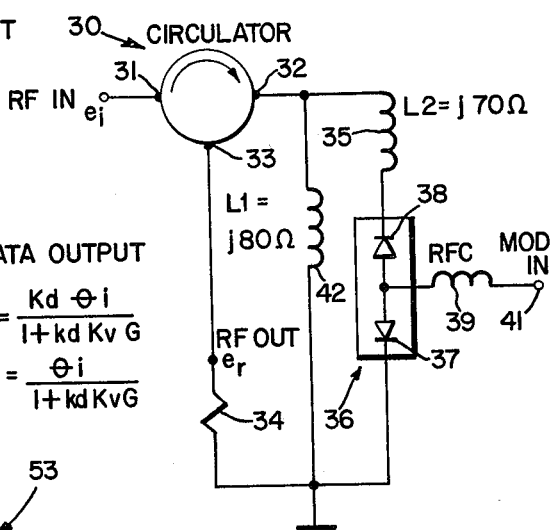
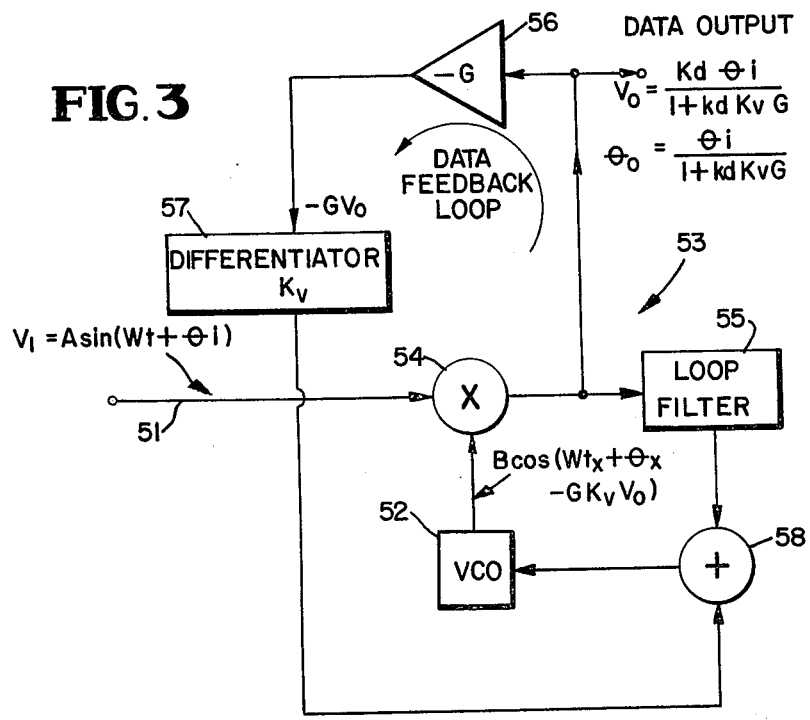

LINEAR PHASE DEMODULATOR INCLUDING A PHASE LOCKED LOOP WITH AUXILIARY FEEDBACK LOOP

ORIGIN OF THE INVENTION

The invention described herein was made by an employee of the United States Government and may be manufactured and used by or for the Government for governmental purposes without the payment of any royalties thereon or therefor.

FIELD OF THE INVENTION

The present invention relates generally to a demodulator for a phase modulated wave and, more particularly, to a demodulator including means for increasing the carrier frequency component to a phase locked loop which derives a data output signal having an amplitude indicative of the phase modulation. In accordance with another aspect, the invention is directed to a linear phase modulator including a nonlinear, voltage controlled reactance and means for compensating for the nonlinearity of the reactor.

BACKGROUND OF THE INVENTION

To promote transmission efficiency, suppressed carrier, phase modulated techniques are now being widely used in communication links for digital data. With such techniques, a transmitted wave includes no carrier component and all of the energy is developed in the side bands. Digital data may be transmitted by modulating the carrier at ± 90°, to provide bi-phase modulation; alternatively, the carrier may be phase modulated in 90° increments to provide quaternary phase digital modulation.

A disadvantage of many prior art phase demodulators is that they have a relatively restricted linear operating region, limited to approximately ± 60° variation in phase modulation relative to the carrier phase. Hence, the prior art devices frequently cannot be utilized to provide an accurate replica of analog variations that produce large phase variations.

BRIEF DESCRIPTION OF THE INVENTION

In accordance with one aspect of the present invention, a demodulator for a phase modulated (PM) wave having a suppressed carrier locks onto the wave by increasing the carrier frequency component in a phase-locked loop. The carrier frequency component is derived in response to an A.C. data output signal derived from a phase detector of the loop. The A.C. data output signal has a magnitude and phase indicative of the phase of the modulated wave. Both the amplitude and phase of the data are approximately directly proportional to the phase modulation so that either of these parameters can be detected to provide the desired information.

While Chaffee, in an article entitled "The Application of Negative Feedback to Frequency Modulated Systems", Bell System Technical Journal, July 1939, pages 404ff, discloses a frequency demodulator wherein the frequency deviation of an FM signal is reduced, there has not apparently been developed any phase demodulator wherein the phase deviation of a phase modulated signal is reduced to restore carrier power for linearity or for lock-on purposes.

In one embodiment of the present invention, the feedback loop restores the carrier frequency power by phase modulating the phase modulated wave with a phase reversed replica of the data output signal of the phase detector. Because of data fed back to the modulator from the phase detector is out of phase with the phase modulated wave supplied to the modulator, there is a reduction in the modulation index which results in an increase of carrier frequency power, in the output of the phase modulator.

Preferably, but not necessarily, the output of the phase modulator is a wave having a phase that is directly proportional to the amplitude of the data output signal subtracted from the phase of the PM wave. By utilizing a linear phase modulator, a phase detector, in the form of a product detector or multiplier, operates in its linear region at high modulation indices, where severe distortion otherwise frequently would occur. In one embodiment a linear phase modulator includes a series branch circuit comprising an inductance and variable capacitance, in the form of a varactor diode. The reactance of the varactor diode is modulated by a 180° out of phase replica of the data output signal of the phase locked loop to produce a reactance modulation across terminals of the branch circuit. The reactance modulation phase modulates an input wave to the modulator through an energy coupler having three ports, one of which is connected to the branch circuit. A second port of the energy coupler is connected to a load, while the third port of the coupler is connected to be responsive to the input wave to the modulator. The impedances connected to the ports of the energy coupler are such that substantially all of the energy coupled by the input wave to the coupler is fed to the load, and virtually none is absorbed by the branch network and none is reflected back to the port to which the input source for the modulator is connected.

A problem with the phase modulator is that the voltage vs. capacitive reactance of the varactor diode is not a linear characteristic. Instead, the reactance of the varactor is proportional to the square root of the applied voltage. Hence, in order to provide a linear phase modulator, it is necessary to provide some type of compensation for the nonlinear voltage vs. capacitive reactance variation of the varactor diode. In the past, such compensation has been attained by utilizing function generator diode networks, which are relatively expensive and complex. In accordance with one aspect of the present invention, compensation for the nonlinear varactor diode characteristic is attained by shunting the branch network with an inductor having a value selected to provide a substantially linear phase shift as a function of voltage applied to the varactor diode, over a phase shift range of substantially ± 90°. By including two such linear phase modulators in the feedback loop of the phase demodulator of the present invention, the linear operating region of the demodulator is extended to greater than ± 160°.

In accordance with a second embodiment of the invention, the carrier frequency component is increased in the phase locked loop by controlling the phase of a voltage controlled oscillator of the loop in response to the data output signal of the loop phase demodulator. In particular, the phase of the voltage controlled oscillator is controlled so that it is directly proportional to the amplitude of the phase detector output subtracted from the phase of the received, PM wave. This decrease in the phase of the voltage controlled oscillator increases carrier frequency component of the input PM wave in a manner similar to the increase of carrier frequency energy to the input of the phase detector from the phase modulator in the first embodiment. The phase of the voltage controlled oscillator is controlled in the second embodiment by differentiating the output of the phase demodulator and adding the differentiated signal to the output of a loop filter of the phase locked loop. Since the output phase of a voltage controlled oscillator is proportional to the integral of the input voltage applied to it, the phase of the voltage controlled oscillator output is directly proportional to the amplitude of the phase demodulator output.

Costas, ("Proceedings of the IRE", December 1956, pages 1713ff) discloses a two-phase synchronous receiver responsive to a suppressed carrier AM signal. The receiver includes a pair of orthogonal channels which attempt to maintain the phase of a local oscillator identical to the phase of the suppressed carrier AM input signal to the receiver. The responses of the orthogonal channels are compared with each other to provide phase control for a local oscillator which drives the two orthogonal channels at phases displaced from each other by 90°. The device disclosed by Costas is, therefore, relatively complex. Further, the apparatus disclosed by Costas is capable of functioning linearly over phase variations only up to ± 70° from the phase of the carrier. For some applications, it is necessary to provide a receiver that can respond to a PM wave having phase modulation of ± 90° or more. The apparatus of the present invention differs basically from that of Costas because the local oscillator of Costas tracks the frequency of the received wave, and does not therefore restore the carrier to the received wave.

It is, accordingly, an object of the present invention to provide a new and improved phase demodulator.

Another object of the invention is to provide a phase demodulator responsive to a phase modulated, suppressed carrier wave.

An additional object of the invention is to provide a new and improved linear phase demodulator.

A further object of the invention is to provide a linear phase demodulator capable of detecting phase variations of ± 160° on a PM wave.

A further object of the invention is to provide a new and improved linear phase modulator.

Another object of the invention is to provide a new and improved linear phase modulator wherein phase modulation is attained by a variable reactance having nonlinear amplitude vs. reactance properties and wherein the nonlinearities are compensated in a relatively inexpensive and simple manner.

The above and still further objects, features and advantages of the present invention will become apparent upon consideration of the following detailed description of several specific embodiments thereof, especially when taken in conjunction with the accompanying drawing.

BRIEF DESCRIPTION OF THE DRAWING

FIG. 1 is a block diagram of one embodiment of a phase demodulator in accordance with the present invention;

FIG. 2 is a circuit diagram of a linear phase modulator that may be employed in the circuit of FIG. 1; and FIG. 3 is a block diagram of a second embodiment of a phase demodulator in accordance with the invention.

DETAILED DESCRIPTION OF THE DRAWING

Reference is now made to FIG. 1 of the drawing wherein there is illustrated a phase demodulator responsive to a wave on lead 11, which is a phase modulated wave represented by:

$$V_1 = A \sin(\omega t + \theta_i) \tag{1}$$

where:
A = maximum amplitude of the wave (constant)
$\omega$ = angular frequency of the wave (constant)
$t$ = time
$\theta_i$ = instantaneous $\theta$ phase of the wave (a variable)

The input wave on lead 11 is typically derived from an intermediate frequency output of a receiver tuned to the carrier frequency of a remote transmitter. Typically, the carrier frequency, $\omega$, has a zero amplitude component, except when the modulation, indicated by $\theta_i$, is of the analog type in which case it usually has a non-zero value. For digital bi-phase modulation, $\theta_i$ usually has a value of ± 90°, while quaternary phase modulation results in $\theta_i$ selectively having one of the values ± 45°, and ± 135°; such digital modulations imply transmission of a suppressed carrier wave, i.e., a wave having zero power at the carrier frequency $\omega$. In response to the variations of $\theta_i$, regardless of the type of modulation, side bands are imposed on the modulated wave applied to lead 11. In accordance with the present invention, some of the energy in the side bands is restored to the carrier by reducing the modulation index of the PM wave on lead 11.

In the embodiment of FIG. 1, energy is restored to the carrier by applying the PM wave on lead 11 to a phase modulator 12, preferably of the linear type. Phase modulator 12 also responds to a relatively high frequency modulating signal on lead 13, which signal has an amplitude and phase approximately, directly proportional to the phase modulation of the input PM wave. Modulator 12 responds to its inputs to derive an output signal including a larger amplitude for the carrier frequency, and a lower modulation index for the side bands containing the information in the wave on lead 11. To this end, phase modulator 12 includes a filter that suppresses any other unwanted side bands that might be derived by the modulator, without introducing any appreciable phase shift to the desired side bands resulting from modulation of the wave on lead 11 by the wave on lead 13. In processing the output signal of modulator 12 it is also necessary to minimize any phase shifts and it is assumed that each of the remaining components described in connection with FIG. 1 have minimum phase shift, unless otherwise indicated.

The output of phase modulator 12 is applied to a phase locked loop 14 including phase detector or product multiplier 15, loop filter 16, and voltage controlled oscillator 17. Phase detector 15 responds to the outputs of phase modulator 12 and voltage controlled oscillator 17 so that when the two inputs to the phase detector are displaced by 90°, a zero output voltage is derived from the phase detector. The phase detector derives an output having an A.C. data component and a D.C. error component indicative of the phase deviation between the carrier frequency of the output of modulator 12 and the frequency derived from voltage controlled oscillator 17. The A.C. data has an amplitude approximately, directly proportional to the phase, $\theta_i$, of the modulation of the input wave on lead 11 and a phase approximately, directly proportional to the phase of the wave on lead 11. Low pass loop filter 16, which may be of order 0, 1, or 2, responds to the D.C. output of phase detector 15; preferably, loop filter 16 is of order 1, to achieve greatest stability and enable an initial zero tracking error to be attained so that the loop has a linear response over a maximum range of phases. The output of loop filter 16 is applied to voltage controlled oscillator 17 which derives an output having a phase proportional to the integral of its input voltage. For the circuit of FIG. 1 the input to oscillator 17 is derived exclusively from loop filter 16.

A feedback loop 18 including polarity inverting amplifier 19, as well as modulator 12, responds to the variable amplitude and phase A.C. data output component of detector 15. The output of amplifier 19, which is a replica of the data output component of phase detector 15, reduces the modulation index of the input PM wave applied to phase modulator 12 by an amount proportional to the output of the phase detector, to reduce the side band energy and restore some of the side band energy to the carrier. Because modulator 12 restores some of the carrier energy to its input wave, phase locked loop 14 locks to a signal even if the carrier has been suppressed. The amount of carrier power restored by phase locked loop 14 is controlled by adjusting the gain, G, of amplifier 19.

To prevent feedback loop 18 from oscillating, the open loop gain must reach 0 db before the open loop phase shift reaches 180°. Generally, this is accomplished by using loop components, i.e., modulator 12, phase detector 15 and amplifier 19, having a wider band width than needed and by adding a single or possibly double pole filter in phase modulator 12, for the data on line 13, to establish the bandwidth and phase characteristics necessary to prevent the loop from oscillating. If any sharp filtering of the input to modulator is needed, such filtering should be performed on the input to the demodulator, prior to the signal being coupled to modulator 12. By performing the filtering as stated, the data bandwidth of loop 18 can be left rather wide, to assure a flat frequency response, without degrading the performance of the demodulator in the presence of noise.

The amount by which the modulation index of the wave on lead 11 is reduced by data feedback loop 18 can be calculated in response to the output of phase detector 15, $V_o$, as follows, by considering that the output of linear phase modulator 12 can be represented as:

$$V_2 = A \sin (\omega t + \theta_i - GK_M V_o) \qquad (2)$$

where:
G = gain of amplifier 19
$K_M$ = sensitivity of modulator 12 (radians/volt)
Voltage controlled oscillator 17 responds to the relatively narrow band output (typically 200 Hertz) of loop filter 16 to derive a wave having a variable frequency and phase as represented by:

$$V_3 = B \cos (\omega_x t + \theta_x) \qquad (3)$$

where:
B = constant maximum amplitude of the output of oscillator 17
$\omega_x$ = variable angular frequency of the output of oscillator 17
$\theta_x$ = variable phase output of oscillator 17

Phase detector 15 responds to the outputs of modulator 12 and voltage controlled oscillator 17 to derive a signal represented by:

$$V_o = [A \sin (\omega t + \theta_i - GK_M V_o)][B \cos (\omega_x t + \theta_x)] \qquad (4)$$

Since only the difference frequency components of the output of phase detector 15 are significant, Equation (4) can be rewritten as:

$$V_o = \frac{AB}{2} \sin (\omega t + \theta_i - GK_M V_o - \omega_x t - \theta_x) \qquad (5)$$

By letting $$\frac{AB}{2} = k_d,$$

the sensitivity of phase detector 15 (in volts per radian), and by assuming that oscillator 17 is locked to the input, suppressed carrier frequency (i.e., $\omega t = \omega_x t$), and by assuming that there is a phase lock between the carrier applied to lead 11 and the output of voltage controlled oscillator 17 (whereby $\theta_x = 0$), Equation (5) simplifies to:

$$V_o = k_d \sin (\theta_i - GK_M V_o) \qquad (6)$$

By assuming that the data feedback loop is maintaining a relatively small error between the data output of phase detector 15 and the data input on lead 11 to phase modulator 12, whereby ($\theta_i - GK_M V_o$) is relatively small and sin ($\theta_i - GK_M V_o$) approximately equals ($\theta_i - GK_M V_o$), Equation (6) further simplifies to:

$$V_o = k_d (\theta_i - GK_M V_o) \qquad (7)$$

which can be rewritten as:

$$V_o = \frac{k_d \theta_i}{1 + GK_M k_d} \qquad (8)$$

A measure between the modulation index of the input wave on lead 11, indicated by $\theta_i$, and the reduced modulation index at the output of phase detector 15, indicated by $\theta_0$, is obtained by substituting $V_o = k_d \theta_0$ into Equation (8) to yield:

$$\theta_0 = \frac{\theta_i}{1 + k_d K_M G} \qquad (9)$$

The A.C. output of phase detector 15 thereby has an amplitude and phase represented by Equations (8) and (9). The amplitude or phase of the data output of phase detector 15 thereby can be utilized as an indication of the modulation index $\theta_i$ of the phase modulated wave applied to lead 11.

In the event of the wave on lead 11 being digitally, bi-phase modulated, linear phase modulator 12 can be replaced by a digital modulator that upon detecting a zero crossing on line 13, subtracts a finite increment of phase from the PM wave on lead 11, the amount of the increment of phase subtracted determines the amount of carrier power restored.

The principles of the present invention can be modified to detect the phase modulation of a digital quaternary phase modulated suppressed carrier wave. To this end, there is provided a second data feedback loop 21 including phase modulator 22 (preferably of the linear type), phase detector 23, and polarity reversing amplifier 24. Modulator 22 is driven in parallel with modulator 12 by the PM wave on lead 11, and includes a modulating input responsive to the output of amplifier 24. Modulator 22 is responsive to data derived from phase detector 23 of data feedback loop 21; the data derived from loop 21 have a phase 90° displaced from the phase of the data derived from loop 18. Phase detector 23 is responsive to the output of modulator 22, as well as the output of voltage controlled oscillator 17, as coupled through 90° phase shifter 25. Phase shifter 25 enables loop 21 to recover the information which is 90° out of phase from the information detected by loop 18. Detector 23 can be driven by the output of voltage controlled oscillator 17, rather than by a separate voltage controlled oscillator, because oscillator 17 derives a frequency that restores the suppressed carrier to phase detector 23.

One preferred embodiment of modulators 12 and 22 for linearly modulating a microwave carrier (such as 2.2 GHZ) is illustrated in FIG. 2. The modulator of FIG. 2 includes a circulator 30 having three ports, 31, 32, and 33. Port 31 is connected to be responsive to the phase modulated wave on lead 11, while port 33 is connected to a load resistor 34, across which is developed the RF output that is applied by the phase modulators to the phase detectors, after having been fed through an appropriate filter. The impedances connected to ports 31-33 are such that there is no appreciable energy reflected back to port 31 and substantially all of the energy from port 32 is coupled to port 33.

The impedance connected to port 32 provides a variable reactance, with virtually no resistive component, to the wave reflected from port 32 to port 33, to thereby effect a linear phase modulation of the energy coupled to port 33. The impedance connected to port 32 comprises a first branch including a high Q inductance 35 connected in series with a variable capacitance 36 and a second branch including high Q inductance 42 that shunts the first branch and compensates for non-linearities of the first branch. Variable capacitance 36 includes a pair of back to back varactor diodes 37 and 38, having a common terminal for their anodes; the common terminal is connected through a choke coil 39 to terminal 41 that is connected to be responsive to a modulating wave, e.g., the output of amplifier 19. The modulating wave varies the capacitance of varactor diodes 37 and 38. Two back to back diodes are used to obtain a push-pull effect that tends to prevent large amplitude signals at terminal 31 from detuning the series resonant circuit comprising inductor 35 and capacitor 36. The back to back diode arrangement also simplifies biasing for diodes 37 and 38 since diode 38 prevents a D.C. short circuit from being presented to the negative voltage applied to terminal 41; the D.C. short circuit would otherwise result from the path through compensating inductance 42.

Mathematically, it can be shown that the voltage at port 33 has a phase angle proportional to the reactance of the impedance at port 32. In particular, assuming purely reactive voltage at port 33 relative to the incident voltage at port 31 is:

$$\frac{e_r}{e_i} = \frac{Z - Z_o}{Z + Z_o} \qquad (10)$$

where:
$e_i$ = the incident voltage at port 31
$e_r$ = the reflected voltage at port 33
$Z_o$ = the characteristic impedance of the circulator
$Z$ = the impedance at port 32

If, as in the case under consideration, Z is purely reactive and $Z_o$ is purely resistive, Equation (10) can be manipulated to give:

$$\frac{e_r}{e_i} = \frac{\sqrt{Z^2 + Z_o^2} \bigg/ \tan^{-1}\left(-\frac{Z}{Z_o}\right)}{\sqrt{Z^2 + Z_o^2} \bigg/ \tan^{-1}\frac{Z}{Z_o}} \qquad (11)$$

which simplifies to:

$$\frac{e_r}{e_i} = 1 \bigg/ -2 \tan^{-1}\left(\frac{Z}{Z_o}\right) \qquad (12)$$

Equation (12) indicates that the phase modulator of FIG. 2 can produce up to 360° of phase modulation.

For one particular type of varactor diode which is utilized for diodes 37 and 38 (MA45068 or GC1504) a series resonant circuit exists in the branch comprising inductor 35 and capacitor 36 while the voltage applied to terminal 41 is −3 volts. In this low-voltage region, the reactance of each of varactors 37 and 38 has a relatively large slope as a function of voltage. However, as the voltage at terminal 41 becomes more negative, the reactance of diodes 37 and 38 changes more slowly to provide a relatively flat region in the phase vs. voltage curve of the impedance of the branch circuit including inductor 35 and capacitor 36. When the voltage at terminal 41 is less than −3 volts, the branch circuit including inductor 35 and capacitor 36 has a capacitive reactance that approaches a condition of parallel resonance with the shunt branch of inductor 42. The approach of parallel resonance between the impedances connected to port 32 results in an increase in the rate of change in the reactance seen by port 32, with a tendency to cancel the effect of the more slowly changing reactance of variable capacitor 36.

Mathematically, it can be shown from Equation (12) that the circuit of FIG. 2 enables linear phase variations to be derived across load resistor 34. In particular, the Equation for the reactance at port 32, assuming inductors 35 and 42 to have negligible resistance, is:

$$Z = \frac{(jX_2 - jX_c) jX_1}{jX_2 - jX_c + jX_1} \qquad (13)$$

where:
$X_1$ = reactance of inductor 42
$X_2$ = reactance of inductor 35, and
$X_c$ = reactance of capacitor 36.

Equation (13) can be rewritten as a function of the voltage applied to terminal 41 as follows:

$$Z = \frac{\left(jX_2 - jX_2\sqrt{\frac{V}{K}}\right)jmX_2}{jX_2 - jX_2\sqrt{\frac{V}{K}} + jmX_2} \quad (14)$$

where:
V = the modulation voltage at terminal 41,
K = the modulation voltage at terminal 41 wherein $jX_2 = -jX_c$, and $$m = \frac{X_1}{X_2}$$

Equation (14) simplifies to:

$$Z = \frac{jX_2\left(1 - \sqrt{\frac{V}{K}}\right)m}{1 - \sqrt{\frac{V}{K}} + m} \quad (15)$$

By substituting Equation (15) into Equation (12) the ratio can be written as:

$$\frac{e_r}{e_i} = -2\tan^{-1}\frac{\left[\left(\frac{X_2}{Z_0}\right)\left(1 - \sqrt{\frac{V}{K}}\right)m\right]}{1 - \sqrt{\frac{V}{K}} + m} \quad (16)$$

Equation (16) is relatively linear over a relatively wide range of voltages applied to terminal 41. Experimentally, it has been found that good linearity is obtained with the following circuit parameters:
$X_2 = j70$,
$M = 1.143$, $$\frac{X_2}{Z_0} = 1.40, \quad \text{and}$$

and
$K = 3$.

In particular, a relatively linear phase shift between approximately 110° and 300° is provided by an input voltage to terminal 41 that varies between 0 and −8.5 volts.

A second embodiment for demodulating a phase modulated wave is illustrated in FIG. 3. The basic concept of circuit of FIG. 3 is the same as that of FIG. 1, in that the modulation index of the input wave on lead 51 is reduced to increase carrier power. However, the carrier power is increased by controlling the frequency of voltage controlled oscillator 52 of phase locked loop 53 in response to the data output of phase detector 54, rather than by directly phase modulating the suppressed carrier input with the output data of the phase detector. To these ends, phase locked loop 53 includes, in addition to voltage controlled oscillator 52 and phase detector 54, low pass loop filter 55 that responds to the low frequency output of the phase detector to supply a control input voltage to oscillator 52.

Oscillator 52 derives an output phase that is displaced from the phase of the phase modulated wave on lead 51 by an amount proportional to the amplitude of the data output signal of phase detector 54. To this end, the output of phase detector 54 is supplied to polarity reversing amplifier 56, the output of which is fed to differentiator 57. The output signal of differentiator 57, proportional to the time rate of change of the amplitude of the output of phase detector 54, is linearly combined in adder 58 with the output of loop filter 55. Because of the phase reversing properties of amplifier 56, the output of summing network 58 is equal to the difference between the outputs of loop filter 55 and differentiator 57. The output of summing network 58 is applied to the control input terminal of voltage controlled oscillator 52, which derives an output signal having a variable frequency and phase. The phase of the output signal of oscillator 52 is directly proportional to the integral of the input voltage to the oscillator, as derived from summing network 58. Thereby, the output of voltage controlled oscillator 52 can be represented as:

$$V_3 = B\cos(\omega_x t + \theta_x - GK_v V_o) \quad (17)$$

where:
B = the constant maximum amplitude of the output of oscillator 52,
$\omega_x$ = variable, angular frequency of the output of oscillator 52,
$\theta_x$ = the variable phase output of oscillator 52,
G = the gain of amplifier 56,
$K_v$ = the combined sensitivities of differentiator 57 and oscillator 52 to the output of amplifier 56, and
$V_o$ = the output of phase detector 54.

Phase detector 54 responds to the signal on lead 51 and the output of oscillator 52 to derive the data output signal, $V_o$, as:

$$V_o = [A\sin(\omega t + \theta_i)][B\cos(\omega_x t + \theta_x - GK_v V_o)] \quad (18)$$

The similarity between the outputs of the phase detectors of FIGS. 1 and 3, as represented by Equations 4 and 18, is to be noted. In particular, the term $V_o$, and its proportionality factors, is shifted from the first bracketed term in Equation (4) to the second bracketed term in Equation (18). The resulting multiplication and analysis of Equation (18) is thereby substantially the same as Equation (4), to yield expressions for the amplitude and phase of the output voltage of phase detector 54 which are of the same format as the output voltage and phase of phase detector 15. In particular, amplitude and phase of the data output signal of phase detector 54 are represented by:

$$V_o = \frac{K_d \theta_i}{1 + K_d K_v G} \quad (19)$$

$$\theta_o = \frac{\theta_i}{1 + K_d K_v G} \quad (20)$$

Either the voltage or phase magnitude indicated by Equations (19) and (20) can be utilized to detect the modulation index of the PM wave on lead 51.

While the configuration of FIG. 3 eliminates the need for a phase modulator, it has the disadvantage of requiring a voltage controlled oscillator having a wide bandwidth. In particular, the bandwidth of the oscillator must be wide enough to accept the data derived from differentiator 57, which has a tendency to have a relatively wide bandwidth because of the nature of the differentiating process. Because oscillator 52 must have a wide bandwidth, it cannot have a high Q, unless the bandwidth of the phase modulated data is very narrow.

While there have been described and illustrated several specific embodiments of the invention, it will be clear that variations in the details of the embodiments specifically illustrated and described may be made without departing from the true spirit and scope of the invention as defined in the appended claims. As an example, phase modulator 12 in FIG. 1 can be connected between voltage controlled oscillator 17 and phase detector 15 to form an alternate embodiment of the invention; in such a configuration phase shifter 25 is directly responsive to the output of oscillator 17.

What is claimed is:

1. Apparatus for demodulating a phase modulated wave comprising a phase locked loop responsive to the phase modulated wave, said loop including: a voltage controlled oscillator, a phase detector responsive to the oscillator and the phase modulated wave for deriving an A.C. data output signal having a magnitude indicative of the phase of the phase modulated wave and a phase indicative of the phase of the modulated wave and for deriving an error signal indicative of the phase deviation between an input carrier wave component of the phase modulated wave and the voltage controlled oscillator, and a loop filter responsive to the error signal for deriving a control signal for the oscillator, means for controlling the oscillator phase in proportion to an integral of the error signal; and a feedback loop responsive to the data output signal for increasing the power of the carrier frequency component in the phase locked loop.

2. The apparatus of claim 1 wherein the feedback loop includes a phase modulator having a modulation input signal responsive to a replica of the data output signal and another input responsive to the phase modulated wave, said modulator deriving the wave replica to which the phase locked loop is responsive.

3. The apparatus of claim 2 wherein the phase modulator is linear to derive an output wave having a phase directly proportional to the phase of the phase modulated wave minus an amount directly proportional to the amplitude of the data output signal.

4. The apparatus of claim 3 wherein the phase modulator includes a parallel substantially all reactive network having a variable reactance of a first type connected in series circuit with a first reactance of a second type opposite from the first type, the value of the variable reactance being controlled by the modulating input signal amplitude such that the reactance value is a non-linear function of the modulation input signal amplitude while the series circuit is approximately at resonance, a second reactance of the second type shunting the series circuit, said first and second reactances having values such that the series circuit has a reactance of the first type that is approximately in parallel resonance with the second reactance to provide compensation for the non-linear relationship between the value of the variable reactance and the modulation input signal; and means for coupling energy from the phase modulated carrier wave to the parallel circuit and for coupling reflected energy from the parallel circuit to the phase detector without coupling any substantial energy from the parallel circuit back to the phase modulated wave source.

5. The apparatus of claim 4 wherein the variable reactance includes a varactor diode.

6. The apparatus of claim 5 wherein the variable reactance further includes a pair of series connected varactor diodes having like electrodes connected together to be responsive to a voltage that is a replica of the modulation input signal.

7. The apparatus of claim 2 wherein the wave is quaternary phase modulated and further comprising another phase modulator responsive to the phase modulated wave, another phase detector responsive to replicas of the another phase modulator and the voltage controlled oscillator, the input to the another phase detector from the voltage controlled oscillator being displaced 90° from the input of the phase detector of the phase locked loop, said another phase detector deriving a data output signal for another channel of phase modulated data on the modulated carrier, and means for feeding the data output signal for the another channel as a modulating input for the another phase modulator.

8. The apparatus of claim 1 wherein the feedback loop includes differentiator means responsive to a replica of the data output signal having an amplitude indicative of the rate of change of the output signal, and means for controlling the oscillator phase by an amount proportional to the integral of the amplitude of the another wave in a sense opposite to that of the loop filter control signal.

9. A circuit for linearly phase modulating an r.f. input in response to a modulation input signal comprising a parallel substantially all reactive network including: a variable reactance of a first type connected in series circuit with a first reactance of a second type opposite from the first type, the value of the variable reactance being controlled by the modulation input signal amplitude such that the reactance value is a non-linear function of the modulation input signal amplitude while the series circuit is approximately at resonance, a second reactance of the second type shunting the series circuit, said first and second reactances having values such that the series circuit has a reactance of the first type that is approximately in parallel resonance with the second reactance to provide compensation for the non-linear relationship between the value of the variable reactance and the modulation input signal; and means for coupling energy from the r.f. input to the parallel circuit and for coupling reflected r.f. energy from the parallel circuit to a load without coupling any substantial r.f. energy back to the r.f. input.

10. The apparatus of claim 9 wherein the variable reactance includes a varactor diode.

11. The apparatus of claim 9 wherein the variable reactance includes a pair of series connected varactor diodes having like electrodes connected together to be responsive to a voltage that is a replica of modulation input signal.

* * * * *